(12) United States Patent
Masuda et al.

(10) Patent No.: US 7,863,540 B2
(45) Date of Patent: Jan. 4, 2011

(54) PLASMA REACTOR

(75) Inventors: Masaaki Masuda, Nagoya (JP); Michio Takahashi, Nagoya (JP); Takeshi Sakuma, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 958 days.

(21) Appl. No.: 11/723,721

(22) Filed: Mar. 21, 2007

(65) Prior Publication Data
US 2008/0072574 A1 Mar. 27, 2008

(30) Foreign Application Priority Data
Mar. 30, 2006 (JP) .............................. 2006-094337

(51) Int. Cl.
*B23K 10/00* (2006.01)
(52) U.S. Cl. ............................. 219/121.36; 219/121.48; 219/121.52
(58) Field of Classification Search ............ 219/121.36, 219/121.48, 121.51, 121.52, 121.59, 121.43, 219/121.54; 373/18–22
See application file for complete search history.

(56) References Cited

U.S. PATENT DOCUMENTS

| 7,112,233 | B2 | 9/2006 | Ohno et al. |
| 7,618,596 | B2 | 11/2009 | Ichikawa et al. |
| 2001/0043890 | A1 | 11/2001 | Son |
| 2003/0160366 | A1 | 8/2003 | Fukura et al. |
| 2004/0071932 | A1 | 4/2004 | Ishihara et al. |
| 2005/0229564 | A1* | 10/2005 | Okubo et al. ............ 55/523 |
| 2006/0051273 | A1* | 3/2006 | Son ...................... 423/215.5 |
| 2008/0118410 | A1* | 5/2008 | Furukawa et al. ...... 422/186.03 |

FOREIGN PATENT DOCUMENTS

| EP | 1 086 740 A2 | 3/2001 |
| EP | 1 544 425 A1 | 6/2005 |
| JP | A 2003-340272 | 12/2003 |
| JP | A 2004-011592 | 1/2004 |
| JP | A 2004-027982 | 1/2004 |

* cited by examiner

*Primary Examiner*—Mark H Paschall
(74) *Attorney, Agent, or Firm*—Oliff & Berridge, PLC

(57) ABSTRACT

The present invention provides a plasma reactor which can suppress deactivation of components (active components) activated by plasma when causing exhaust gas to flow through a plasma generating space to ensure efficient reaction between the active components and particulate matter, whereby the particulate matter can be efficiently purified via reaction. The plasma reactor includes a plasma reactor main body 1, a positive electrode 11 disposed on an inlet side 2 of the plasma reactor main body 1, a conductive honeycomb filter 21 disposed so that a filter inlet side 22 faces an outlet side 3 of the plasma reactor main body 1, and a pulse power supply 31 which is connected with the positive electrode 11 and the honeycomb filter 21 and is capable of applying a pulse voltage between the positive electrode 11 and the honeycomb filter 21 as plasma generating electrodes to generate plasma.

21 Claims, 1 Drawing Sheet

PLASMA REACTOR

BACKGROUND OF THE INVENTION

1. Field of the Invention

The present invention relates to a plasma reactor. More particularly, the present invention relates to a plasma reactor which can suppress deactivation of components (active components) activated by plasma when causing exhaust gas to flow through a plasma generating space to ensure efficient reaction between the active components and particulate matter, whereby the particulate matter can be efficiently purified via reaction.

2. Description of Related Art

A silent discharge occurs when disposing a dielectric between two electrodes and applying a high alternating voltage or a periodic pulse voltage between the electrodes. Active species, radicals, and ions are produced in the resulting plasma field to promote reaction and decomposition of gases. It is known that this phenomenon can be utilized to remove toxic components contained in engine exhaust gas and the like (see patent documents 1 and 2, for example).

The inventions disclosed in the patent documents 1 and 2 aim at efficiently generating radicals and the like by plasma. However, the inventions disclosed in the patent documents 1 and 2 are insufficient from the viewpoint of purifying particulate matter (PM) contained in exhaust gas.

A plasma reactor has been disclosed which includes a plasma reactor main body and a diesel particulate filter (DPF) disposed downstream from the plasma reactor main body (see patent document 3, for example). According to the plasma reactor disclosed in the patent document 3, exhaust gas is activated in the plasma reactor main body, and PM is oxidized by the activated components while trapping PM in the DPF.

[Patent document 1] JP-A-2004-27982
[Patent document 2] JP-A-2003-340272
[Patent document 3] JP-A-2004-11592

SUMMARY OF THE INVENTION

According to the invention disclosed in the patent document 3, PM can be trapped and oxidized in the DPF. On the other hand, components activated in the plasma reactor main body are deactivated with time after flowing out from the plasma reactor main body. Therefore, the activated components have been deactivated at a specific percentage when purifying PM trapped in the DPF. Accordingly, in order to sufficiently purify PM trapped in the DPF, it is necessary to generate additional plasma in the plasma reactor main body to generate additional active components, taking deactivation into consideration.

The present invention has been achieved in view of the above-described problem. An object of the present invention is to provide a plasma reactor which can suppress deactivation of components (active components) activated by plasma when causing exhaust gas to flow through a plasma generating space to ensure efficient reaction between the active components and particulate matter, whereby the particulate matter can be efficiently purified via reaction.

In order to achieve the above object, the present invention provides the following plasma reactor.

[1] A plasma reactor comprising: an insulating plasma reactor main body which is cylindrically formed and allows gas to pass therethrough from one end (inlet side) to the other end (outlet side); a positive electrode disposed on the inletside of the plasma reactor main body; a conductive honeycomb filter which includes porous partition walls with a plurality of cells serving as gas passages, in which specific cells (inlet open cells) of which one end (filter inlet side) is open and the other end (filter outlet side) is plugged and the remaining cells (outlet open cells) of which the filter inlet end is plugged and the filter outlet end is open are alternately disposed, and which is disposed so that the filter inlet end faces the outlet side of the plasma reactor main body; and a pulse power supply which is connected with the positive electrode and the honeycomb filter and is capable of applying a pulse voltage between the positive electrode and the honeycomb filter as plasma generating electrodes.

[2] The plasma reactor according to [1], wherein the plasma reactor main body is a honeycomb structure including partition walls with a plurality of cells serving as gas passages.

[3] The plasma reactor according to [2], wherein the positive electrode forming the plasma generating electrode has a mesh structure, and a mesh interval of the mesh structure is 2 to 20 times a cell pitch of the plasma reactor main body in a cross section perpendicular to the gas flow direction.

[4] The plasma reactor according to [2], wherein the positive electrode forming the plasma generating electrode includes a plurality of strip-shaped conductive members arranged in parallel, and an arrangement interval of the conductive members is 2 to 20 times a cell pitch of the plasma reactor main body in a cross section perpendicular to the gas flow direction.

[5] The plasma reactor according to any one of [1] to [4], wherein a catalyst is supported on the plasma reactor main body.

[6] The plasma reactor according to [5], wherein the catalyst includes at least one element selected from the group consisting of a noble metal, aluminum, nickel, zirconium, titanium, cerium, cobalt, manganese, zinc, and barium.

[7] The plasma reactor according to [6], wherein the noble metal is at least one element selected from the group consisting of platinum, rhodium, palladium, ruthenium, silver, and gold.

[8] The plasma reactor according to any one of [1] to [7], wherein the plasma reactor main body includes at least one compound selected from the group consisting of alumina, zirconia, silicon nitride, aluminum nitride, sialon, mullite, silica, and cordierite.

[9] The plasma reactor according to any one of [1] to [8], wherein a catalyst is supported on the honeycomb filter.

[10] The plasma reactor according to [9], wherein the catalyst includes at least one compound selected from the group consisting of alumina, silica, titania, zirconia, and ceria.

[11] The plasma reactor according to any one of [1] to [10], wherein the honeycomb filter is formed of a conductive ceramic.

[12] The plasma reactor according to [11], wherein the conductive ceramic includes silicon carbide.

[13] The plasma reactor according to any one of [1] to [12], wherein the honeycomb filter has a cell density of 4 to 186 cells/cm$^2$.

[14] The plasma reactor according to any one of [1] to [13], wherein the honeycomb filter has a length in the gas flow direction of 5 to 200 mm.

[15] The plasma reactor according to any one of [2] to [14], wherein, when the plasma reactor main body is a honeycomb structure, the plasma reactor main body has a cell density of 4 to 186 cells/cm$^2$.

[16] The plasma reactor according to any one of [1] to [15], wherein the plasma reactor main body has a length in the gas flow direction of 5 to 40 mm.

[17] The plasma reactor according to any one of [1] to [16], wherein a distance between the positive electrode and the plasma reactor main body is 0.05 to 10 mm.

[18] The plasma reactor according to any one of [1] to [17], wherein a surface of the positive electrode is covered with an insulator.

[19] The plasma reactor according to any one of [1] to [18], wherein a surface of the positive electrode is covered with a corrosion-resistant metal.

[20] The plasma reactor according to any one of [1] to [19], wherein a voltage waveform supplied from the pulse power supply is a pulse waveform having a peak voltage of 1 kV or more and a pulse number per second of 1 or more, an AC voltage waveform having a peak voltage of 1 kV or more and a frequency of 1 or more, a DC waveform having a voltage of 1 kV or more, or a voltage waveform formed by superimposing these waveforms.

[21] The plasma reactor according to any one of [1] to [20], wherein the plasma reactor is installed in a combustion exhaust gas from a diesel engine.

According to the plasma reactor of the present invention, since the positive electrode and the conductive honeycomb filter are disposed so that the plasma reactor main body is placed in between and the pulse power supply is connected with the positive electrode and the honeycomb filter, a pulse voltage can be applied between the positive electrode and the honeycomb filter, whereby components activated in the plasma reactor main body are rarely deactivated after moving into the honeycomb filter. Specifically, since plasma is also generated in the honeycomb filter by using the conductive honeycomb filter as the electrode, deactivation of the activated components can be suppressed. This enables deactivation of components (active components) activated by plasma to be suppressed when causing exhaust gas to flow through a plasma generating space to ensure efficient reaction between the active components and particulate matter, whereby the particulate matter can be efficiently purified via reaction.

DETAILED DESCRIPTION OF THE EMBODIMENT

Figure 1:
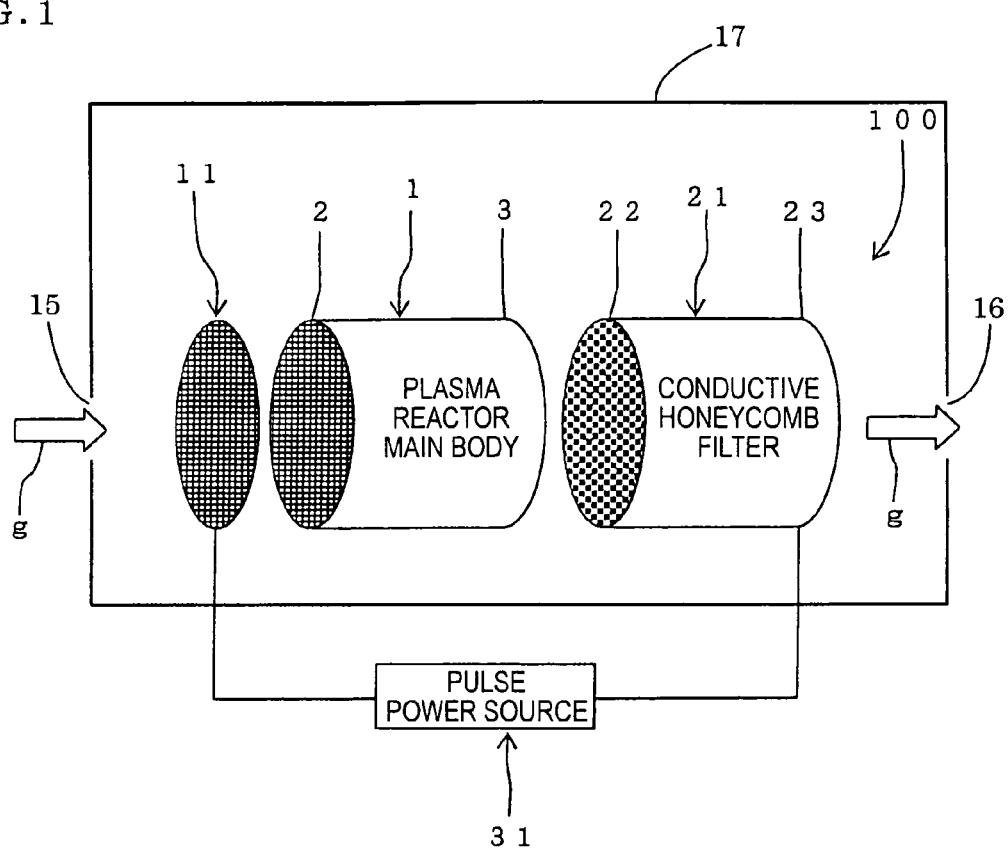
FIG. 1 is a schematic view showing one embodiment of a plasma reactor according to the present invention.

Embodiments of the present invention are described below in detail with reference to the drawings. Note that the present invention is not limited to the following embodiments. Various modifications and improvements of the design may be made without departing from the scope of the present invention based on common knowledge of a person skilled in the art.

FIG. 1 is a schematic view showing one embodiment of a plasma reactor according to the present invention. As shown in FIG. 1, a plasma reactor 100 according to this embodiment includes a plasma reactor main body 1, a positive electrode 11, a conductive honeycomb filter 21, and a pulse power supply 31. The pulse power supply 31 is connected with the positive electrode 11 and the conductive honeycomb filter 21. FIG. 1 shows a state in which the plasma reactor main body 1, the positive electrode 11, and the honeycomb filter 21 are separated. In order to efficiently generate plasma and suppress deactivation of components activated by plasma, it is preferable to dispose the positive electrode 11 and the plasma reactor main body 1 at a specific interval described later and to cause the honeycomb filter 21 to contact an outlet side 3 of the plasma reactor main body 1.

In the plasma reactor 100 according to this embodiment, since the conductive honeycomb filter 21 is used as one electrode, plasma is generated in the plasma reactor main body 1 and the cells of the honeycomb filter 21 when applying a pulse voltage between the positive electrode 11 and the conductive honeycomb filter 21 used as plasma generating electrodes. Therefore, when causing exhaust gas to flow into the plasma reactor main body 1 through an inlet-side end 2, active components such as active oxygen, ozone, $NO_x$, oxygen radicals, and $NO_x$ radicals are produced by plasma generated in the plasma reactor main body 1. Even if the active components move into the honeycomb filter, the active components are not deactivated due to plasma generated in the honeycomb filter, whereby the active components can be efficiently utilized to purified s trapped particulate matter.

The plasma reactor main body 1 forming the plasma reactor 100 according to this embodiment has insulating properties and is cylindrically formed so that gas can pass through the plasma reactor main body 1 from one end (inlet side 2) to the other end (outlet side 3). Regarding the insulating properties of the plasma reactor main body 1, when cutting a rectangular parallelepiped sample with a length in the gas flow direction of 3.3 cm and a cross-sectional area of 1.1 cm$^2$ (cross-sectional area of the cross section perpendicular to the gas flow direction) from the plasma reactor main body 1, and measuring the resistivity of the sample at 1000° C. by a constant-current four-terminal method using a direct-current power supply at an voltage terminal distance of 2.5 cm, the resistivity of the sample is preferably $1 \times 10^4$ ohm·cm or more, and more preferably $1 \times 10^5$ ohm·cm or more. An arbitrary structure may be used as the plasma reactor main body 1 insofar as the structure allows gas to pass therethrough. It is preferable that the plasma reactor main body 1 have a multi-layer structure, a honeycomb structure, or the like, with the honeycomb structure being particularly preferable. In this embodiment, the plasma reactor main body 1 is a cylindrical honeycomb structure. Note that the shape of the plasma reactor main body 1 is not limited thereto. The plasma reactor main body 1 may be a honeycomb structure of another shape such as a quadrangular prism. The term "honeycomb structure" used herein refers to a structure including partition walls with a plurality of cells serving as gas passages. When the plasma reactor main body 1 is a honeycomb structure, the shape of the cell is not limited to a quadrangle as employed in this embodiment. The shape of the cell may be a circle, an ellipse, a triangle, an approximate triangle, another polygonal shape, or the like.

When the plasma reactor main body 1 is a honeycomb structure, it is preferable that the cell density of the honeycomb structure be 4 to 186 cells/cm$^2$. If the cell density is less than 4 cells/cm$^2$, the region in which plasma is generated by surface discharge on the partition walls of each cell becomes scattered, whereby exhaust gas activation efficiency may be decreased. If the cell density is greater than 186 cells/cm$^2$, the back pressure of the honeycomb filter may be increased. The length of the plasma reactor main body 1 in the gas flow direction is preferably 5 to 40 mm, and more preferably 10 to 30 mm. If the length is less than 5 mm, since the region in which plasma is generated by surface discharge becomes too narrow, most of target substances contained in exhaust gas exit the plasma reactor main body 1 without being activated or oxidized, for example. If the length is greater than 40 mm, a large amount of power is required to generate plasma. Moreover, it may become difficult to provide the plasma reactor in an exhaust system of an automobile or the like due to an increase in the size of the plasma reactor main body 1.

The plasma reactor main body 1 is formed of an insulating material. It is preferable that the plasma reactor main body 1 is formed of a ceramic. As the ceramic, alumina, zirconia, silicon nitride, aluminum nitride, sialon, mullite, silica, cordierite, or the like may be suitably used. These materials may be used either individually or in combination of two or more.

It is preferable that a catalyst be supported on the plasma reactor main body 1 in order to efficiently produce highly oxidative active components such as active oxygen by plasma. Since the active components can be efficiently produced by causing the catalyst to be supported on the plasma reactor main body 1, the amount of energy supplied to generate plasma can be reduced. The catalyst to be supported is not particularly limited insofar as the catalyst causes the active components such as active oxygen to be produced from exhaust gas by plasma. As the catalyst, a precious metal such as platinum, rhodium, palladium, ruthenium, silver, or gold, aluminum, nickel, zirconium, titanium, cerium, cobalt, manganese, zinc, barium, or the like may be suitably used. As examples of the coating layer component for supporting the metal catalyst component, $Al_2O_3$, $SiO_2$, $TiO_2$, $ZrO_2$, $CeO_2$, and the like can be given.

It is preferable that the positive electrode 11 used in this embodiment be formed of a highly conductive metal or a highly conductive ceramic. As preferred examples of the highly conductive metal, a metal or an alloy containing at least one component selected from the group consisting of iron, gold, silver, copper, titanium, aluminum, nickel, chromium, tungsten, and molybdenum can be given. As an example of the highly conductive ceramic, silicon carbide can be given. In this case, the positive electrode 11 may be formed of only silicon carbide, or may contain silicon carbide as one component. It is preferable that the positive electrode 11 be covered with a corrosion-resistant metal in order to prevent corrosion. As examples of the corrosion-resistant metal, gold, platinum, silver, and the like can be given. It is preferable that the surface of the positive electrode 11 be covered with an insulator. Plasma can be easily and uniformly generated from the entire electrode by covering the surface of the positive electrode 11 with an insulator. As examples of the insulator, ceramics such as alumina, zirconia, silicon nitride, aluminum nitride, sialon, mullite, silica, and cordierite can be given. As the structure of the positive electrode 11, a mesh structure can be given. In this case, the shape of the mesh is not limited to a quadrangle. The shape of the mesh may be a circle, an ellipse, a triangle, an approximate triangle, or another polygonal shape. When the plasma reactor main body 1 is a honeycomb structure, the mesh interval of the mesh structure is preferably 2 to 20 times the cell pitch of the honeycomb structure in the cross section perpendicular to the gas flow direction. The positive electrode 11 may have a structure in which strip-shaped conductive members are arranged in parallel. The positive electrode 11 may be formed to have a size corresponding to the inlet side 2 of the plasma reactor main body 1. It is preferable that the arrangement interval of the conductive members be 2 to 20 times the cell pitch of the plasma reactor main body 1 in the cross section perpendicular to the gas flow direction. The thickness of the positive electrode 11 is preferably 1 to 2 mm.

The distance between the positive electrode 11 and the plasma reactor main body 1 is preferably 0.05 to 10 mm, and more preferably 0.1 to 5 mm. If the distance is less than 0.05 mm, a short circuit may easily occur due to electric field concentration. If the distance is greater than 10 mm, plasma generation efficiency may be decreased.

The honeycomb filter 21 used in this embodiment includes porous partition walls with a plurality of cells serving as gas passages, in which specific cells (inlet open cells) of which one end (filter inlet end) 22 is open and the other end (filter outlet end) 23 is plugged and the remaining cells (outlet open cells) of which the filter inlet end 22 is plugged and the filter outlet end 23 is open are alternately disposed. A honeycomb filter having such a structure is suitably used as a diesel particulate filter (DPF) for trapping particulate matter contained in engine exhaust gas and the like. When applying a voltage to the honeycomb filter 21 from the pulse power supply 31, plasma is generated in the cells to suppress deactivation of the active components generated in the plasma reactor main body. This enables the plasma reactor 100 according to this embodiment to ensure efficient reaction between the active components and particulate matter, whereby the particulate matter can be efficiently purified via reaction.

The honeycomb filter 21 is conductive since the honeycomb filter 21 is used as the plasma generating electrode. The material for the honeycomb filter 21 is not particularly limited insofar as the material is not an insulator. It is preferable that the material for the honeycomb filter 21 have a low electric resistance. Regarding the electric resistance of the honeycomb filter 21, when cutting a rectangular parallelepiped sample with a length in the gas flow direction of 3.3 cm and a cross-sectional area of 1.1 $cm^2$ (cross-sectional area of the cross section perpendicular to the gas flow direction) from the honeycomb filter 21, and measuring the resistivity of the sample at 1000° C. by a constant-current four-terminal method using a direct-current power supply at an voltage terminal distance of 2.3 cm, the resistivity of the sample is preferably $1 \times 10^3$ ohm·cm or less, and more preferably $1 \times 10^2$ ohm·cm or less. For example, the material for the honeycomb filter 21 is preferably a conductive ceramic. It is particularly preferable that the material for the honeycomb filter 21 contain silicon carbide (SiC) as a component.

The density of the cells formed by the partition walls of the honeycomb filter 21 is not particularly limited. The cell density is preferably 4 to 186 cells/$cm^2$ from the viewpoint of efficiently removing particulate matter. The thickness of the partition wall is not particularly limited. The mechanical strength of the honeycomb filter 21 is decreased as the thickness of the partition wall is reduced, whereby the honeycomb filter 21 may break due to impact or thermal stress caused by a change in temperature. The volume of the cells in the honeycomb filter 21 is decreased as the thickness of the partition wall is increased, whereby the back pressure of the honeycomb filter 21 may be increased. The thickness of the partition wall is preferably 0.05 to 2 mm from the above viewpoint. The length of the honeycomb filter 21 in the gas flow direction is preferably 5 to 200 mm.

Particulate matter contained in exhaust gas and active components produced in the plasma reactor main body flow into the honeycomb filter 21. The particulate matter is trapped by the partition walls, and the trapped particulate matter is oxidized by the active components. In order to promote oxidation (combustion) of the particulate matter, it is preferable to coat the surface of the exhaust gas passage (surface of the partition wall) of the DPF which contacts exhaust gas with a substance exhibiting catalytic effects (i.e. cause a catalyst to be supported on the surface). The substance may be selected from metal oxides such as alumina ($Al_2O_3$), silica ($SiO_2$), titania ($TiO_2$), zirconia ($ZrO_2$), and ceria ($CeO_2$). Of these, $CeO_2$ is particularly preferable. These substances may be used either individually or in combination of two or more. The amount of metal oxide used for coating is preferably 0.1 to 20 mass %, and more preferably 1 to 10 mass % of the support. A transition metal and/or a precious metal may also be supported. As specific examples of the transition metal and the precious metal, transition metals such as Ni, Fe, Co, and Mn and precious metals such as Pt, Rh, Pd, Ru, and Ag can be given. The amount of metal to be supported is preferably 0.1 to 20 mass %, and more preferably 1 to 10 mass % of the metal oxide. These metals may be used either individually or in combination of two or more. As examples of the support, HY-type zeolite, HX-type zeolite, H-type mordenite, silica-alumina, metal silicate, silica-alumina, zeolite, silica gel, zirconia, titania-alumina, cordierite, Ag, Au, Ce, Co, Cr, Cu, Fe, Li, Ni, Mn, Mo, Pd, Pt, Rh, V, W, Zn, and the like can be given. The DPF may be coated with such a support.

The pulse power supply 31 used in this embodiment preferably supplies a pulse waveform having a peak voltage of 1 kV or more and a pulse number per second of 1 or more, an AC voltage waveform having a peak voltage of 1 kV or more and a frequency of 1 or more, a DC waveform having a voltage of 1 kV or more, or a voltage waveform formed by superimposing these waveforms. Note that the pulse power supply 31 is not particularly limited insofar as the pulse power supply 31 can apply a pulse voltage to the positive electrode 11 and the honeycomb filter 21 as the plasma electrodes to generate plasma in the plasma reactor main body 1. The peak voltage when applying a pulse voltage is preferably 1 to 20 (kV), and more preferably 5 to 10 (kV). The pulse number is preferably 0.5 to 5 (kHz), and more preferably 1 to 4 (kHz).

Since the plasma reactor 100 according to this embodiment can efficiently purify PM via reaction, as described above, it is preferable to use the plasma reactor 100 in a state in which the plasma reactor 100 is installed in combustion exhaust gas from a diesel engine.

One embodiment of a method of manufacturing the plasma reactor according to the present invention is described below. It is preferable to produce the positive electrode forming the plasma reactor according to this embodiment by forming a highly conductive metal or a highly conductive ceramic in the shape of a mesh or a strip in the same manner as the positive electrode 11 shown in FIG. 1. The forming method is not particularly limited. A known ceramic forming method or a known metal forming method may be used.

A method of producing the plasma reactor main body 1 forming the plasma reactor according to this embodiment is not particularly limited. For example, when the plasma reactor main body 1 is a ceramic honeycomb structure, the plasma reactor main body 1 may be produced using a known method of producing a ceramic honeycomb structure. For example, specific forming raw materials are kneaded to prepare clay, and the resulting clay is formed to produce a honeycomb-shaped formed product. The honeycomb-shaped formed product is dried to obtain a honeycomb formed product, and the honeycomb formed product is fired to obtain a ceramic honeycomb structure. The method of causing the catalyst to be supported on the plasma reactor main body 1 is not particularly limited. The catalyst may be supported on the plasma reactor main body 1 using a method such as immersing the plasma reactor main body in a solution in which the catalyst is dispersed.

A method of producing the honeycomb filter 21 forming the plasma reactor according to this embodiment is not particularly limited. The honeycomb filter 21 may be produced using a known method of producing a DPF. For example, a ceramic honeycomb structure is produced in the same manner as in the above method of producing the plasma reactor main body 1, and the ends of each cell are alternately plugged so that the inlet open cells and the outlet open cells are alternately disposed to obtain the honeycomb filter 21. The catalyst may be supported on the honeycomb filter 21 in the same manner as in the case of causing the catalyst to be supported on the plasma reactor main body 1.

As the pulse power supply 31 forming the plasma reactor according to this embodiment, a high-voltage pulse power supply using an SI thyristor (manufactured by NGK Insulators, Ltd.) or the like may be used.

The plasma reactor main body 1, the positive electrode 11, the honeycomb filter 21, and the pulse power supply 31 thus produced are disposed as shown in FIG. 1, and the pulse power supply 31 is electrically connected with the positive electrode 11 and the conductive honeycomb filter 21 using conductive wires. It is preferable to dispose the positive electrode 11 so that the positive electrode 11 contacts the inlet side 2 of the plasma reactor main body 1. It is preferable to dispose the honeycomb filter 21 in a state in which the filter inlet end 22 nearly contacts the outlet side 3 of the plasma reactor main body 1. It is preferable to use the plasma reactor main body 1, the positive electrode 11, and the honeycomb filter 21 in a casing 17 having a gas inlet 15 and outlet 16.

EXAMPLES

The present invention is described below in more detail by way of examples. Note that the present invention is not limited to the following examples.

Example 1

Plasma Reactor Main Body (Honeycomb Structure)

A plasma reactor main body was produced by extruding cordierite as a raw material using a metal die so that the length in the exhaust gas flow direction was 5 mm, the diameter of the end face was 93 mm, the cell pitch was 2.5 mm, and the thickness of the partition wall was 0.43 mm, and then firing the resulting product.

Positive Electrode

A mesh-type electrode was used as the positive electrode. The positive electrode was formed of conductive members arranged in parallel in the vertical direction and the horizontal direction at intervals (5.0 mm) twice the cell pitch of the plasma reactor main body. The positive electrode was formed by punching a stainless steel sheet material.

Honeycomb Filter (DPF)

A silver paste was applied to and baked on the end face (filter outlet end) of an SiC-DPF (manufactured by NGK Insulators, Ltd., length in exhaust gas flow direction: 100 mm, diameter of end face: 93 mm, cell pitch: 2.5 mm) to form a current-carrying part to obtain a honeycomb filter.

Pulse Power Supply

A high-voltage pulse power supply using an SI thyristor switching (manufactured by NGK Insulators, Ltd.).

Plasma Reactor

The plasma reactor main body, the positive electrode, the honeycomb filter, and the pulse power supply thus produced were disposed as shown in FIG. 1, and the pulse power supply was electrically connected with the positive electrode and the conductive honeycomb filter using conductive wires. In this case, the honeycomb filter serves as a negative electrode. The positive electrode was disposed on the inlet side of the plasma reactor main body. The honeycomb filter was disposed in a state in which the filter inlet end was in contact with the outlet side of the plasma reactor main body. A pulse voltage was applied from the pulse power supply at a peak voltage of 10 (kV) and a pulse number of 1 (kHz).

Exhaust Gas Processing Test

Exhaust gas produced from a direct-injection diesel engine with a displacement of 1400 cc at a rotational speed of 2000 rpm was processed for 30 minutes by circulating the exhaust gas in the plasma reactor while applying a pulse voltage. The $NO_x$ concentration and the amount of deposited particulate matter (PM) were measured using the following methods. The results are shown in Table 1.

Measurement of $NO_x$ Concentration

The exhaust gas flowing out from the plasma reactor was sampled one minute after starting circulation of the exhaust gas, and the $NO_x$ concentration in the sample was measured. The $NO_x$ concentration was measured using a gas analyzer SIGU-837 manufactured by Horiba, Ltd. The $NO_x$ concentration in the exhaust gas before circulating the exhaust gas in the plasma reactor was 1150 ppm.

Measurement of Amount of Deposited PM

The mass of the honeycomb filter was measured before and after the exhaust gas purification test, and the difference in mass was taken as the amount of deposited PM. The amount of discharged PM before circulating the exhaust gas in the plasma reactor was 30 (mg/min).

Example 3

A plasma reactor was produced in the same manner as in Example 2 except that a catalyst ($Pt/Al_2O_3$) was also supported on the honeycomb filter (DPF). The catalyst was supported on the honeycomb filter in the same manner as described in "Method of supporting catalyst on plasma reactor main body". The exhaust gas purification test was carried out and the $NO_x$ concentration and the amount of deposited PM were measured in the same manner as in Example 1. The results are shown in Table 1.

Example 4

A plasma reactor was produced in the same manner as in Example 3 except for using SiC as the material for the plasma reactor main body. The exhaust gas purification test was carried out and the $NO_x$ concentration and the amount of deposited PM were measured in the same manner as in Example 1. The results are shown in Table 1.

TABLE 1

| | Catalyst supported on plasma reactor main body | Catalyst supported on DPF | Electrode position | $NO_x$ concentration (ppm) | Amount of PM in DPF (mg) |
|---|---|---|---|---|---|
| Example 1 | None | None | Plasma reactor main body/DPF | 378 | 531 |
| Example 2 | $Pt/Al_2O_3$ | None | Plasma reactor main body/DPF | 265 | 450 |
| Example 3 | $Pt/Al_2O_3$ | $Pt/Al_2O_3$ | Plasma reactor main body/DPF | 230 | 360 |
| Example 4 | $Pt/Al_2O_3$ | $Pt/Al_2O_3$ | SiC-honeycomb/DPF | 219 | 333 |
| Example 5 | $Co/Al_2O_3$ | None | Plasma reactor main body/DPF | 104 | 369 |
| Example 6 | $Co/Al_2O_3$ | $Pt/Al_2O_3$ | Plasma reactor main body/DPF | 69 | 315 |
| Comparative Example 1 | None | None | Plasma reactor main body/plasma reactor main body | 403 | 855 |
| Comparative Example 2 | $Pt/Al_2O_3$ | None | Plasma reactor main body/plasma reactor main body | 288 | 819 |
| Comparative Example 3 | $Pt/Al_2O_3$ | $Pt/Al_2O_3$ | Plasma reactor main body/plasma reactor main body | 276 | 675 |
| Comparative Example 4 | $Co/Al_2O_3$ | None | Plasma reactor main body/plasma reactor main body | 68 | 846 |

Example 2

A plasma reactor was produced in the same manner as in Example 1 except for causing a catalyst ($Pt/Al_2O_3$) to be supported on the plasma reactor main body. The catalyst was supported on the plasma reactor main body using the following method. The exhaust gas purification test was carried out and the $NO_x$ concentration and the amount of deposited PM were measured in the same manner as in Example 1. The results are shown in Table 1.

Method of Supporting Catalyst on Plasma Reactor Main Body

Alumina fine powder (specific surface area: 100 m²/g) was impregnated with a dinitrodiamine Pt aqueous solution, dried at 120° C., and fired at 550° C. for three hours to obtain Pt/alumina powder containing Pt in an amount of 10 mass % of the alumina. Alumina sol and water were added to the Pt/alumina powder to obtain a slurry. The plasma reactor main body was immersed in the slurry, dried, and fired to cause the catalyst to be supported on the surface of the wall of the plasma reactor main body on which exhaust gas flows.

Example 5

A plasma reactor was produced in the same manner as in Example 1 except for causing a catalyst ($Co/Al_2O_3$) to be supported on the plasma reactor main body. The catalyst was supported on the plasma reactor main body in the same manner as described in "Method of supporting catalyst on plasma reactor main body" except for using a cobalt nitrate aqueous solution instead of the dinitrodiamine Pt aqueous solution. The exhaust gas purification test was carried out and the $NO_x$ concentration and the amount of deposited PM were measured in the same manner as in Example 1. The results are shown in Table 1.

Example 6

A plasma reactor was produced in the same manner as in Example 5 except that a catalyst ($Pt/Al_2O_3$) was also supported on the honeycomb filter (DPF). The catalyst was supported on the honeycomb filter in the same manner as described in "Method of supporting catalyst on plasma reactor main body". The exhaust gas purification test was carried out and the $NO_x$ concentration and the amount of deposited PM were measured in the same manner as in Example 1. The results are shown in Table 1.

Comparative Example 1

A plasma reactor was produced in the same manner as in Example 1 except that a mesh-type electrode similar to the positive electrode was disposed on the outlet side of the plasma reactor main body as a negative electrode, and the pulse power supply was connected with the positive electrode disposed on the inlet side of the plasma reactor main body and the negative electrode (mesh-type electrode) disposed on the outlet side of the plasma reactor main body so that a pulse voltage was applied between these electrodes (pulse voltage was not applied to the honeycomb filter (DPF)). The exhaust gas purification test was carried out and the $NO_x$ concentration and the amount of deposited PM were measured in the same manner as in Example 1. The results are shown in Table 1.

Comparative Example 2

A plasma reactor was produced in the same manner as in Comparative Example 1 except for causing a catalyst ($Pt/Al_2O_3$) to be supported on the plasma reactor main body. The catalyst was supported on the plasma reactor main body in the same manner as described in "Method of supporting catalyst on plasma reactor main body". The exhaust gas purification g test was carried out and the $NO_x$ concentration and the amount of deposited PM were measured in the same manner as in Example 1. The results are shown in Table 1.

Comparative Example 3

A plasma reactor was produced in the same manner as in Comparative Example 2 except that a catalyst ($Pt/Al_2O_3$) was also supported on the honeycomb filter (DPF). The catalyst was supported on the honeycomb filter in the same manner as described in "Method of supporting catalyst on plasma reactor main body". The exhaust gas purification g test was carried out and the $NO_x$ concentration and the amount of deposited PM were measured in the same manner as in Example 1. The results are shown in Table 1.

Comparative Example 4

A plasma reactor was produced in the same manner as in Comparative Example 1 except for causing a catalyst ($Co/Al_2O_3$) to be supported on the plasma reactor main body. The catalyst was supported on the plasma reactor main body in the same manner as described in "Method of supporting catalyst on plasma reactor main body" except for using a cobalt nitrate aqueous solution instead of the dinitrodiamine Pt aqueous solution. The exhaust gas purification test was carried out and the $NO_x$ concentration and the amount of deposited PM were measured in the same manner as in Example 1. The results are shown in Table 1.

As is clear from Table 1, since the plasma reactors according to Examples 1 to 6 use the honeycomb filter (DPF) as the plasma generating electrode, the amount of deposited particulate matter (PM) was small in comparison with Comparative Examples 1 to 4. This indicates that PM was efficiently purified.

As is clear from Examples 1 to 6, it was found that it is preferable to cause the catalyst to be supported on the plasma reactor main body and the honeycomb filter from the viewpoint of reducing the $NO_x$ concentration and the amount of PM in the DPF. In particular, it is considered that plasma generated in the plasma reactor main body interacts with the catalyst supported on the plasma reactor main body to significantly reduce the $NO_x$ concentration and the amount of PM in the DPF.

The plasma reactor according to the present invention may be utilized to remove toxic components contained in engine exhaust gas or the like. In particular, the plasma reactor according to the present invention may be suitably utilized as a plasma reactor for effectively removing particulate matter contained in exhaust gas.

What is claimed is:

1. A plasma reactor having a gas inlet and a gas outlet, the plasma reactor comprising:
an insulating plasma reactor main body which is cylindrically formed and allows gas to pass therethrough from one end (inlet side) to the other end (outlet side);
a positive electrode disposed on the inlet side of the plasma reactor main body, the positive electrode being spaced from the plasma reactor main body in an axial direction of the plasma reactor;
an electrically conductive honeycomb filter which includes porous partition walls with a plurality of cells serving as gas passages, in which specific cells (inlet open cells) of which one end (filter inlet side) is open and the other end (filter outlet side) is plugged and the remaining cells (outlet open cells) of which the filter inlet end is plugged and the filter outlet side is open are alternately disposed, and which is disposed so that the filter inlet side faces the outlet side of the plasma reactor main body, and the electrically conductive honeycomb filter being a negative electrode
a pulse power supply which is connected with the positive electrode and the honeycomb filter and is capable of applying a pulse voltage between the positive electrode and the electrically conductive honeycomb filter as plasma generating electrodes to generate plasma.

2. The plasma reactor according to claim 1, wherein the plasma reactor main body is a honeycomb structure including partition walls with a plurality of cells serving as gas passages.

3. The plasma reactor according to claim 2, wherein the positive electrode forming the plasma generating electrode has a mesh structure, and a mesh interval of the mesh structure is 2 to 20 times a cell pitch of the plasma reactor main body in a cross section perpendicular to the gas flow direction.

4. The plasma reactor according to claim 2, wherein the positive electrode forming the plasma generating electrode includes a plurality of strip-shaped conductive members arranged in parallel, and an arrangement interval of the conductive members is 2 to 20 times a cell pitch of the plasma reactor main body in a cross section perpendicular to the gas flow direction.

5. The plasma reactor according to claim 1, wherein a catalyst is supported inside of the plasma reactor main body.

6. The plasma reactor according to claim 5, wherein the catalyst includes at least one element selected from the group consisting of a noble metal, aluminum, nickel, zirconium, titanium, cerium, cobalt, manganese, zinc, and barium.

7. The plasma reactor according to claim 6, wherein the noble metal is at least one element selected from the group consisting of platinum, rhodium, palladium, ruthenium, silver, and gold.

8. The plasma reactor according to claim 1, wherein the plasma reactor main body includes at least one compound selected from the group consisting of alumina, zirconia, silicon nitride, aluminum nitride, sialon, mullite, silica, and cordierite.

9. The plasma reactor according to claim 1, wherein a catalyst is supported on the electrically conductive honeycomb filter.

10. The plasma reactor according to claim 9, wherein the catalyst includes at least one compound selected from the group consisting of alumina, silica, titania, zirconia, and ceria.

11. The plasma reactor according to claim 1, wherein the electrically conductive honeycomb filter is formed of an electrically conductive ceramic.

12. The plasma reactor according to claim 11, wherein the conductive ceramic includes silicon carbide.

13. The plasma reactor according to claim 1, wherein the electrically conductive honeycomb filter has a cell density of 4 to 186 cells/cm$^2$.

14. The plasma reactor according to claim 1, wherein the electrically conductive honeycomb filter has a length in the gas flow direction of 5 to 200mm.

15. The plasma reactor according to claim 2, wherein, when the plasma reactor main body is a honeycomb structure, the plasma reactor main body has a cell density of 4 to 186 cells/cm$^2$.

16. The plasma reactor according to claim 1, wherein the plasma reactor main body has a length in the gas flow direction of 5 to 40 mm.

17. The plasma reactor according to claim 1, wherein a distance between the positive electrode and the plasma reactor main body is 0.05 to 10 mm.

18. The plasma reactor according to claim 1, wherein a surface of the positive electrode is covered with an electrical insulator.

19. The plasma reactor according to claim 1, wherein a surface of the positive electrode is covered with a corrosion-resistant metal.

20. The plasma reactor according to claim 1, wherein a voltage waveform supplied from the pulse power supply is a pulse waveform having a peak voltage of 1 kV or more and a pulse number per second of 1 or more, an AC voltage waveform having a peak voltage of 1 kV or more and a frequency of 1 or more, a DC waveform having a voltage of 1 kV or more, or a voltage waveform formed by superimposing these waveforms.

21. The plasma reactor according to claim 1, wherein the plasma reactor is configured to be installed in a combustion exhaust gas path from a diesel engine.

* * * * *